(12) United States Patent
Chang et al.

(10) Patent No.: US 6,774,042 B1
(45) Date of Patent: Aug. 10, 2004

(54) PLANARIZATION METHOD FOR DEEP SUB MICRON SHALLOW TRENCH ISOLATION PROCESS

(75) Inventors: Chia-Der Chang, Hsin-Chu (TW); Yi-Tung Yen, Hsin-Dam (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/083,991

(22) Filed: Feb. 26, 2002

(51) Int. Cl.[7] .............. H01L 21/302; H01L 21/31; H01L 21/4763; H01L 21/311

(52) U.S. Cl. .............. 438/692; 438/780; 438/781; 438/782; 438/692; 438/633; 438/693; 438/697; 438/698; 438/699; 438/700; 438/702; 438/703

(58) Field of Search .............. 438/780–782, 438/692, 633, 693, 697–700, 702–703, 626, 631, 725, 760

(56) References Cited

U.S. PATENT DOCUMENTS

| | | | |
|---|---|---|---|
| 5,077,234 A | * 12/1991 | Scoopo et al. | 438/427 |
| 5,126,006 A | * 6/1992 | Cronin et al. | 438/702 |
| 5,173,439 A | * 12/1992 | Dash et al. | 438/424 |
| 5,362,669 A | * 11/1994 | Boyd et al. | 438/437 |
| 5,494,857 A | * 2/1996 | Cooperman et al. | 438/437 |
| 5,728,621 A | * 3/1998 | Zheng et al. | 438/427 |
| 5,851,899 A | * 12/1998 | Weigand | 438/427 |
| 6,004,653 A | * 12/1999 | Lee | 428/141 |
| 6,037,251 A | 3/2000 | Tu et al. | 438/626 |
| 6,090,714 A | * 7/2000 | Jang et al. | 438/692 |
| 6,114,220 A | 9/2000 | Tsai | 438/435 |
| 6,117,798 A | * 9/2000 | Fang et al. | 438/782 |
| 6,171,962 B1 | * 1/2001 | Karlsson et al. | 438/692 |
| 6,180,525 B1 | 1/2001 | Morgan | 438/692 |
| 6,221,560 B1 | * 4/2001 | Soo et al. | 430/311 |
| 6,255,161 B1 | * 7/2001 | Lin | 438/254 |
| 6,270,353 B1 | 8/2001 | Andrews et al. | 434/424 |
| 6,287,174 B1 | * 9/2001 | Detzel et al. | 451/41 |
| 6,365,523 B1 | * 4/2002 | Jang et al. | 438/692 |
| 6,383,933 B1 | * 5/2002 | Shu et al. | 438/692 |
| 6,420,226 B1 | * 7/2002 | Chen et al. | 438/238 |
| 6,436,833 B1 | * 8/2002 | Pang et al. | 438/692 |
| 6,455,428 B1 | * 9/2002 | Tseng | 438/689 |
| 6,461,932 B1 | * 10/2002 | Wang | 438/400 |
| 6,489,216 B1 | * 12/2002 | Shiu et al. | 438/401 |
| 6,511,576 B2 | * 1/2003 | Klein | 216/89 |
| 6,524,950 B1 | * 2/2003 | Lin | 438/644 |
| 6,613,690 B1 | * 9/2003 | Chang et al. | 438/712 |
| 2001/0006761 A1 | * 7/2001 | Golz et al. | 430/311 |
| 2003/0203633 A1 | * 10/2003 | Sinha | 438/692 |
| 2003/0203634 A1 | * 10/2003 | Homma et al. | 438/692 |

FOREIGN PATENT DOCUMENTS

JP     2002270688 A    * 9/2002     ......... H01L/21/768

OTHER PUBLICATIONS

Stanley Wolf, Silicon Processing for VLSI Era, Lattice Press, vol. II, 20–22, 45–46, and 49.*
TW Publication No. 299463/406359/364166.

* cited by examiner

Primary Examiner—John F. Niebling
Assistant Examiner—Stanetta Isaac
(74) Attorney, Agent, or Firm—George O. Saile; Stephen B. Ackerman; Larry J. Prescott

(57) ABSTRACT

A method of planarizing wafers using shallow trench isolation is described. The method uses a very hard polishing pad and chemical mechanical polishing with no additional etching required. Trenches are formed in a substrate and filled with a trench dielectric, such as silicon dioxide deposited using high density plasma chemical vapor deposition. A layer of resist is then formed on the layer of trench dielectric. The wafer is then planarized using chemical mechanical polishing and a polishing pad having a hardness of at least Shore "D" 52. The hard polishing pad avoids scratch marks on the trench dielectric, the substrate surface, or any other materials deposited on the substrate surface.

19 Claims, 4 Drawing Sheets

PLANARIZATION METHOD FOR DEEP SUB MICRON SHALLOW TRENCH ISOLATION PROCESS

BACKGROUND OF THE INVENTION (1) Field of the Invention

This invention relates to planarization of wafers using deep sub micron shallow trench isolation and more particularly to planarization methods using chemical mechanical polishing which avoids scratch marks on the planarized surface.

(2) Description of the Related Art

Shallow trench isolation is frequently used for isolation in integrated circuit wafers. With dense patterns in the active chip areas filling the trenches with dielectric results in uneven topology which must be planarized before subsequent processing steps are carried out. Chemical mechanical polishing is frequently used to accomplish this planarization but problems such as surface scratching must be overcome.

U.S. Pat. No. 6,180,525 to Morgan describes a method of minimizing repetitive chemical mechanical polishing scratch marks.

U.S. Pat. No. 5,728,621 to Zheng et al. describes a method of planarizing a high quality oxide used in shallow trench isolation.

U.S. Pat. No. 6,037,251 to Tu et al. describes a method for planarizing spin-on-glass used for intermetal insulation.

U.S. Pat. No. 6,270,353 to Andrews et al. describes a method for planarizing a structure such as a shallow trench isolation region.

U.S. Pat. No. 6,114,220 to Tsai describes a method of fabrication a shallow trench isolation including the formation of a trench in a substrate.

SUMMARY OF THE INVENTION

Shallow trench isolation is frequently used to isolate active areas on a insulated circuit wafers. When the trenches are filled with a dielectric the top surface of the dielectric can be very irregular and non planar, especially when large active areas are separated by isolation trenches. These irregular dielectric surfaces must be planarized prior to subsequent processing steps.

It is a principal objective of this invention to provide methods for planarizing wafers having shallow trench isolation with dielectric filling the trenches.

Shallow isolation trenches are formed in a semiconductor wafer, such as a silicon wafer, having devices formed therein. The isolation trenches isolate active areas of the chips in the wafer. The isolation trenches are then filled with a dielectric. The objective of this invention is achieved by forming a layer of resist material, such as photoresist, on the layer of dielectric used to fill the trenches. A polishing pad having a hardness of at least Shore "D" 52 is provided. The wafer is then planarized using this polishing pad and chemical mechanical polishing.

The planarization removes all of the resist and part of the dielectric, usually that part of the dielectric above the top surface of the wafer. If a pad oxide and a layer of silicon nitride are formed on the wafer before the isolation trenches are formed the planarization usually removes that part of the dielectric above the layer of silicon nitride.

DESCRIPTION OF THE PREFERRED EMBODIMENTS

Figure 1A:
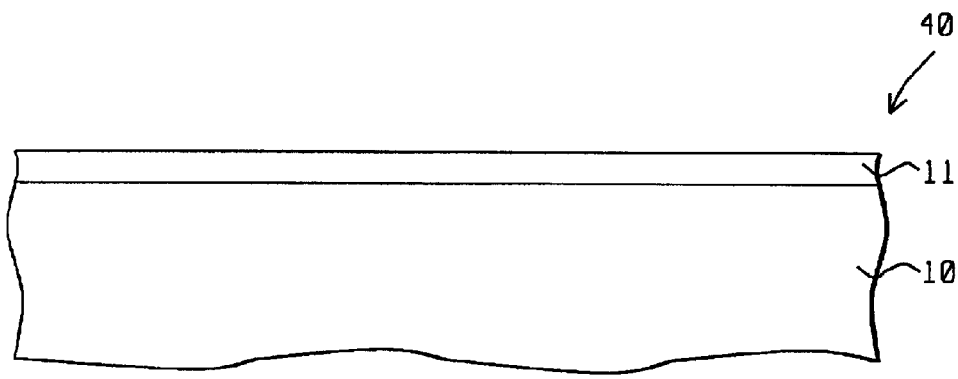
FIG. 1A shows a cross section view of a semiconductor substrate having dielectric formed thereon.
Figure 1B:
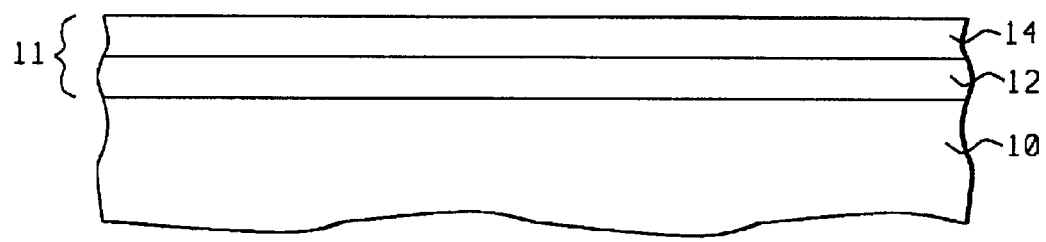
FIG. 1B shows a cross section view of the dielectric showing a layer of pad oxide formed on the substrate and a layer of silicon nitride formed on the layer of pad oxide.

Refer now to FIGS. 1A–9 for the following description of the preferred embodiments of the methods of this invention for planarizing substrates having shallow trench isolation. FIG. 1A shows a cross section view of a part of a wafer 40 comprising a substrate 10, such as a silicon substrate having devices formed therein, having a dielectric base 11 formed on the substrate 10. Any devices formed in the substrate are not shown in the Drawings since they are not critical to the methods of this invention. As shown in FIG. 1B the dielectric base 11 is usually, but not necessarily, a layer of pad oxide 12 formed on the substrate 10 and a layer of silicon nitride 14 formed on the layer of pad oxide. The dielectric base 11 could also be a single dielectric material.

Figure 2:
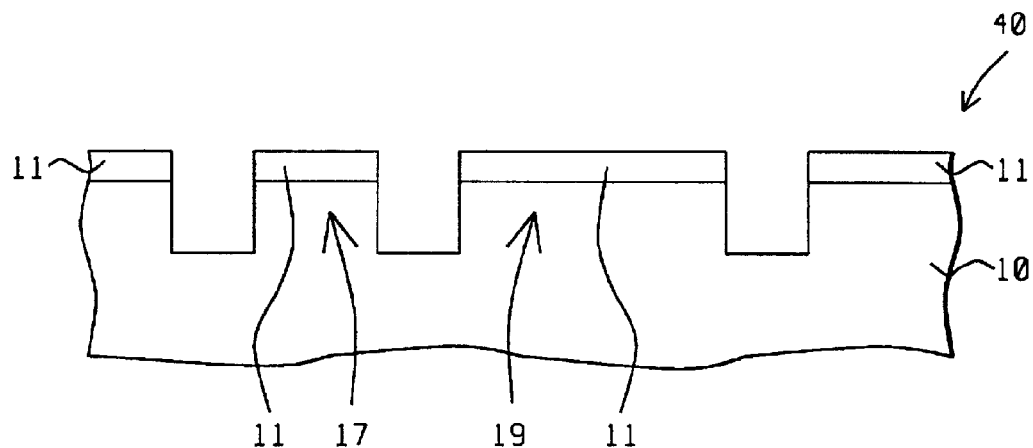
FIG. 2 shows a cross section view of the substrate of FIG. 1A after shallow isolation trenches have been formed.
Figure 3:
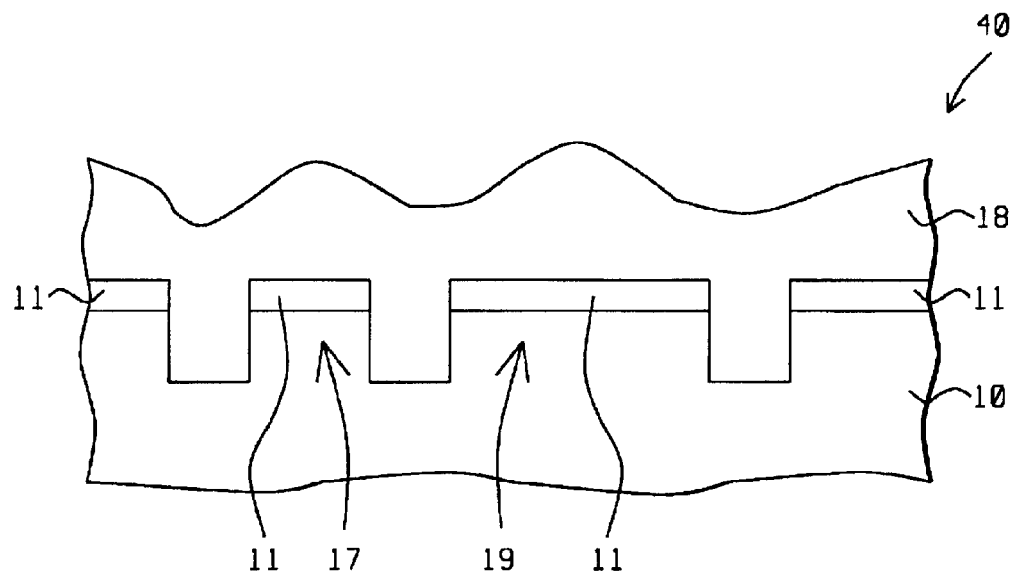
FIG. 3 shows a cross section view of the substrate of FIG. 2 after a layer of dielectric has been deposited filling the isolation trenches.

As shown in FIG. 2, trench openings are formed in the dielectric base 11 and trenches are formed in the substrate 10. The trenches segment the substrate 10 into smaller active areas 17, larger active areas 19, and trenches. Next as shown in FIG. 3, a layer of trench dielectric 18 is deposited on the substrate filling the trenches with trench dielectric 18. The trench dielectric 18 is a relatively dense dielectric such as silicon dioxide deposited using high density plasma chemical vapor deposition. As shown in FIG. 3, the trench dielectric 18 forms a very irregular top surface due to the trenches, the smaller active areas 17, and the larger active areas 19. The parts of the top surface of the layer of trench dielectric 18 over the larger active areas 19 will be higher than the parts over the smaller active areas 17 and over the trenches.

Figure 4:
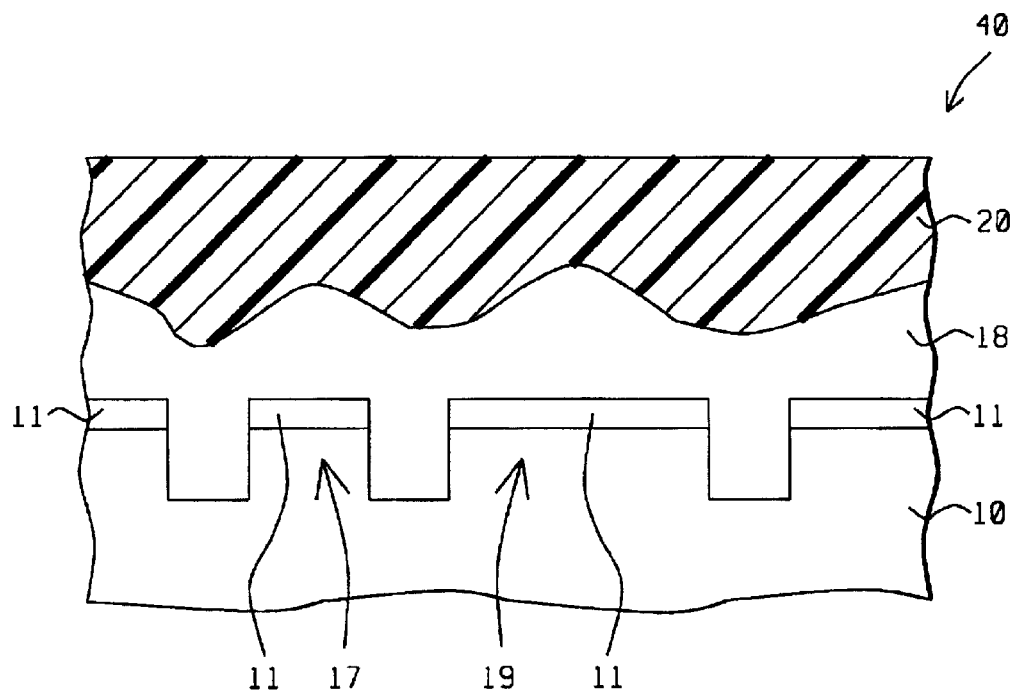
FIG. 4 shows a cross section view of the substrate of FIG. 3 after a layer of resist has been formed on the layer of dielectric.
Figure 5:
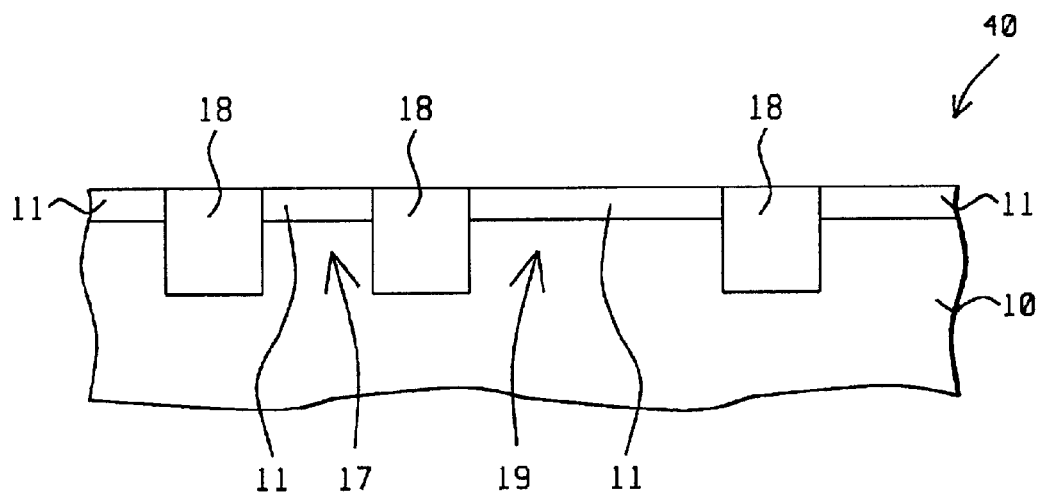
FIG. 5 shows a cross section view of the substrate of FIG. 4 after the substrate has been planarized.

As shown in FIG. 4 a layer of resist 20, such as photoresist, is formed on the layer of trench dielectric 18. The resist 20 can be deposited using a method such as spinning liquid resist on the substrate and forms a planar top surface even though it is formed on a layer of trench dielectric 18 having an irregular top surface. The resist is then cured, usually by baking the resist. Next the wafer 40 is planarized by removing all of the resist 20 and a part of the trench dielectric 18. This planarization is accomplished using a hard polishing pad and chemical mechanical polishing. FIG. 5 shows the wafer 40 after the planarization has been completed showing trench dielectric 18 remaining in the trenches and a wafer 40 having a planar top surface. That part of the trench dielectric 18 above the top surface of the base dielectric 11 is usually removed.

Figure 6:
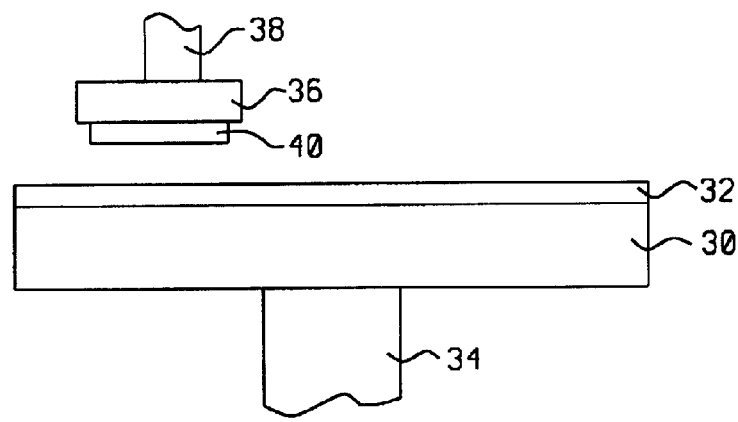
FIG. 6 shows a schematic view of a chemical mechanical polishing apparatus having a polishing pad with a hardness of at least Shore "D" 52.

FIG. 6 shows a schematic view of a chemical mechanical polishing apparatus. The apparatus comprises a hard polishing pad 32 on a rotating base 30. The rotating base is attached to a shaft 34 which rotates the base 30. The wafer to be planarized 40 is attached to a wafer holder 36. The wafer holder 36 is attached to a shaft 38 which both positions the wafer 40 relative to the polishing pad 32 and rotates the wafer 40 during the polishing.

One of the key features of this invention is that the polishing pad 32 is very hard having a hardness of at least Shore "D" 52. This hard polishing pad planarizes the wafer without leaving scratch marks on the remaining trench dielectric 18, any base dielectric 11 on the surface of the substrate 10, or the surface of the substrate 10 if there is no base dielectric 11 used on the substrate 10. No etching other than the chemical mechanical polishing is required for the planarization of the wafer.

Figure 7:
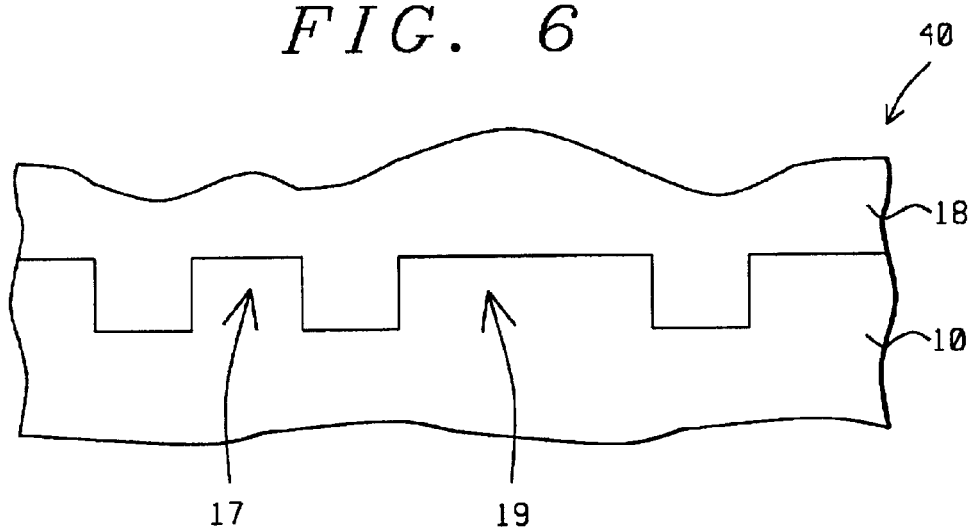
FIG. 7 shows a cross section view of a semiconductor substrate without a layer of pad oxide or a layer of silicon nitride after shallow isolation trenches have been formed and a layer of dielectric has been deposited filling the isolation trenches.

This invention can also be used if there is no base dielectric 11 formed on the substrate 10. FIG. 7 shows a cross section of a wafer 40 with no base dielectric formed on the substrate 10, trenches formed in the substrate 10, and a layer of trench dielectric 18 formed on the substrate wherein the trench dielectric 18 fills the trenches. As in the preceding embodiment the trenches segment the substrate 10 into smaller active areas 17 and larger active areas 19. As in the preceding embodiment, the trench dielectric 18 is a relatively dense dielectric such as silicon dioxide deposited using high density plasma chemical vapor deposition. As shown in FIG. 7, the trench dielectric 18 forms a very irregular top surface due to the trenches, the smaller active areas 17, and the larger active areas 19. The parts of the top surface of the layer of trench dielectric 18 over the larger active areas 19 will be higher than the parts of the trench dielectric 18 over the smaller active areas 17 and over the trenches.

Figure 8:
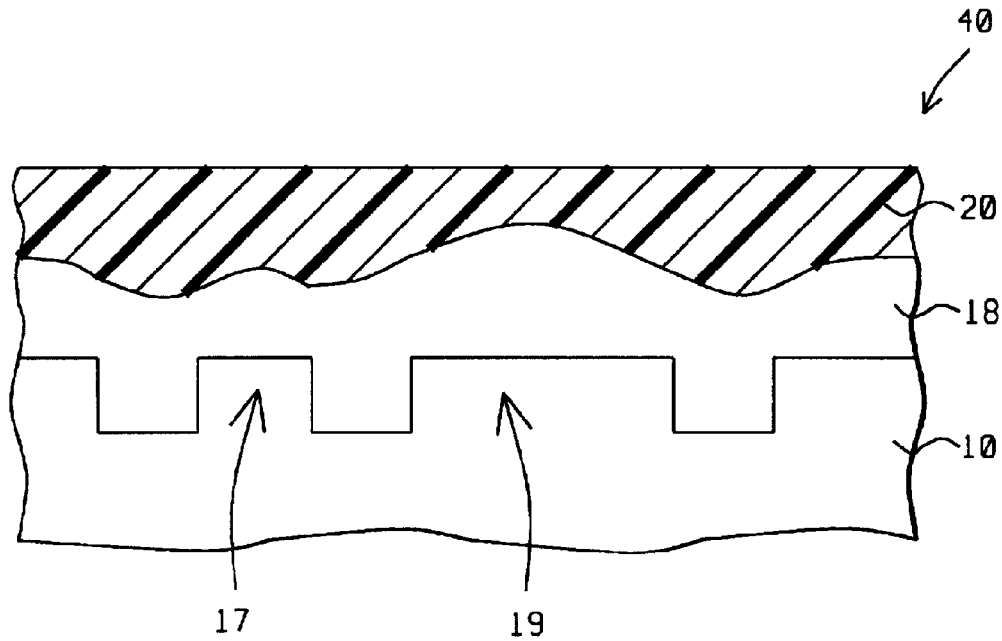
FIG. 8 shows a cross section view of the substrate of FIG. 7 after a layer of resist has been formed on the layer of dielectric.

As shown in FIG. 8 a layer of resist 20, such as photoresist, is formed on the layer of trench dielectric 18. The resist 20 can be deposited using a method such as spinning liquid resist on the substrate and forms a planar top surface even though it is formed on a layer of trench dielectric 18 having an irregular top surface. The resist is then cured, usually by baking the resist.

Figure 9:
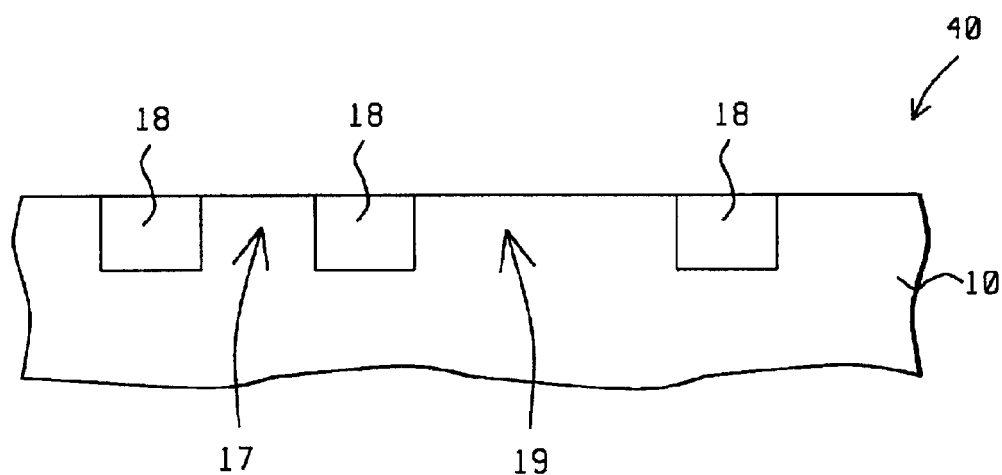
FIG. 9 shows a cross section view of the substrate of FIG. 8 after the substrate has been planarized.

Next the wafer 40 is planarized by removing all of the resist 20 and a part of the trench dielectric 18. This planarization is accomplished using a hard polishing pad and chemical mechanical polishing. FIG. 9 shows the wafer 40 after the planarization has been completed showing trench dielectric 18 remaining in the trenches and a wafer 40 having a planar top surface. Usually that part of the trench dielectric 18 above the top surface of the substrate 10 is removed. As in the preceding embodiment the planarization is accomplished using chemical mechanical polishing, a hard polishing pad, and chemical mechanical polishing apparatus, as shown in FIG. 6 and described in the preceding embodiment.

In this embodiment, as in the preceding embodiment, a key to the invention is that the polishing pad 32, see FIG. 6, is very hard having a hardness of at least Shore "D" 52. This hard polishing pad planarizes the wafer without leaving scratch marks on the remaining trench dielectric 18 or on the surface of the substrate 10. No etching other than the chemical mechanical polishing is required for the planarization of the wafer.

While the invention has been particularly shown and described with reference to the preferred embodiments thereof, it will be understood by those skilled in the art that various changes in form and details may be made without departing from the spirit and scope of the invention.

What is claimed is:

1. A method of planarizing substrates having shallow trench isolation, comprising:

providing a substrate;

forming trenches in said substrate;

depositing a layer of dielectric on said substrate thereby filling said trenches with said dielectric;

forming a layer of resist on said layer of dielectric;

providing a polishing pad having a hardness of at least Shore "D" 52; and removing all of said layer of resist and part of said layer of dielectric using said polishing pad and chemical mechanical polishing thereby leaving said trenches filled with trench dielectric and forming a planar surface.

2. The method of claim 1 wherein said substrate is a silicon wafer having devices formed therein.

3. The method of claim 1 wherein said dielectric is silicon dioxide deposited using high density plasma chemical vapor deposition.

4. The method of claim 1 wherein said trenches are shallow trench isolation trenches.

5. The method of claim 1 wherein said layer of resist is formed by spinning resist on said substrate followed by baking said resist.

6. The method of claim 1 wherein said resist is photoresist.

7. The method of claim 6 wherein said photoresist is formed by spinning said photoresist on said substrate followed by baking said photoresist.

8. The method of claim 1 wherein said removing said layer of resist and part of said layer of dielectric removes that part of said layer of dielectric above said substrate.

9. The method of claim 1 further comprising:

forming a layer of pad oxide on said substrate before said forming trenches in said substrate;

forming a layer of silicon nitride on said layer of pad oxide before said forming trenches in said substrate; and forming trench openings in said layer of pad oxide and said layer of silicon nitride before said forming trenches in said substrate.

10. The method of claim 9 wherein said removing said layer of resist and part of said layer of dielectric removes that part of said layer of dielectric above said layer of silicon nitride.

11. A method of planarizing substrates having shallow trench isolation, comprising:

providing a substrate;

forming a dielectric base on said substrate;

forming trench openings in said dielectric base;

forming trenches in said substrate directly below said trench openings in said dielectric base;

depositing a layer of trench dielectric on said dielectric base thereby filling said trenches with said trench dielectric;

forming a layer of resist on said layer of trench dielectric;

providing a polishing pad having a hardness of at least Shore "D" 52; and removing all of said layer of resist and part of said layer of trench dielectric using said polishing pad and chemical mechanical polishing thereby leaving trench dielectric in said trenches and forming a planar surface.

12. The method of claim 11 wherein said substrate is a silicon substrate having devices formed therein.

13. The method of claim 11 wherein said trench dielectric is silicon dioxide deposited using high density plasma chemical vapor deposition.

14. The method of claim 11 wherein said dielectric base comprises a layer of pad oxide formed on said substrate and a layer of silicon nitride on said layer of pad oxide.

15. The method of claim 14 wherein said removing said layer of resist and part of said layer of dielectric removes that part of said layer of dielectric above said layer of silicon nitride.

16. The method of claim 11 wherein said layer of resist is formed by spinning resist on said substrate followed by baking said resist.

17. The method of claim 11 wherein said resist is photoresist.

18. The method of claim 16 wherein said photoresist is formed by spinning said photoresist on said substrate followed by baking said photoresist.

19. The method of claim 11 wherein said removing said layer of resist and part of said layer of dielectric removes that part of said layer of dielectric above said dielectric base.

* * * * *